United States Patent [19]

Morrell

[11] Patent Number: 5,578,921
[45] Date of Patent: Nov. 26, 1996

[54] MAGNETIC RESONANCE IMAGING USING THREE-DIMENSIONAL SPECTRAL-SPATIAL EXCITATION

[75] Inventor: Glen R. Morrell, Stanford, Calif.

[73] Assignee: Board of Trustees of the Leland Stanford Junior University, Palo Alto, Calif.

[21] Appl. No.: 370,907

[22] Filed: Jan. 10, 1995

[51] Int. Cl.[6] .................................................. G01R 33/20
[52] U.S. Cl. .......................................... 324/307; 324/309
[58] Field of Search .................................. 324/307, 309, 324/300, 314, 312; 128/653.2

[56] References Cited

U.S. PATENT DOCUMENTS

| | | | |
|---|---|---|---|
| 4,628,262 | 12/1986 | Maudsley | 324/309 |
| 4,881,032 | 11/1989 | Bottomley et al. | 324/309 |
| 4,902,973 | 2/1990 | Keren | 324/309 |
| 4,985,677 | 1/1991 | Pauly | 324/309 |
| 4,999,580 | 3/1991 | Meyer et al. | 324/309 |
| 5,162,736 | 11/1992 | Mansfield et al. | 324/309 |
| 5,233,301 | 8/1993 | Meyer et al. | 324/309 |
| 5,245,282 | 9/1993 | Mugler, III et al. | 324/309 |
| 5,270,653 | 12/1993 | Pauly | 324/309 |
| 5,275,164 | 1/1994 | Maeda et al. | 324/309 |
| 5,283,526 | 2/1994 | Spielman et al. | 324/309 |

OTHER PUBLICATIONS

Spielman, et al., H Spectroscopic Imaging Using a Spectral–Spatial Excitation Pulse, Mag. Res. in Medicine, vol. 18, 1991, pp. 269–279.

Meyer, et al., Simultaneous Spatial and Spectral Selective Excitation, Mag. Res. in Medicine, vol. 15, 1990, pp. 287–304.

Pauly, et al. A K–Space Analysis of Small–Tip–Angle Excitation, Journal of Magnetic Resonance, vol. 81, 1989, pp. 43–56.

Primary Examiner—Sandra L. O'Shea
Assistant Examiner—Raymond Y. Mah
Attorney, Agent, or Firm—Townsend and Townsend and Crew; Henry K. Woodward

[57] ABSTRACT

Using 3-D spectral-spatial excitation, the center frequency of the spectral passband can be varied as a function of two spatial coordinates. Such variation could be tailored to field map data to compensate for $B_0$ shifts. The 3-D excitation has 3-D spiral trajectories in k-space.

16 Claims, 4 Drawing Sheets

MAGNETIC RESONANCE IMAGING USING THREE-DIMENSIONAL SPECTRAL-SPATIAL EXCITATION

The U.S. Government has rights in the disclosed invention pursuant to NIH Grant No. CA-48269 and NIGMS No. 5&32GM07365 to Stanford University.

BACKGROUND OF THE INVENTION

This invention relates generally to Magnetic Resonance Imaging (MRI) and more particularly the invention relates to the spectral-spatial magnetic excitation selective simultaneously in two spatial dimensions and in the spectral (i.e. chemical shift) dimension.

Magnetic resonance imaging (MRI) is a non-destructive method for the analysis of materials and represents a new approach to medical imaging. It is generally noninvasive and does not involve ionizing radiation. In very general terms, nuclear magnetic moments are excited at specific spin precession frequencies which are proportional to the local magnetic field. The radio-frequency signals resulting from the precession of these spins are received using pickup coils. By manipulating the magnetic fields, an array of signals is provided representing different regions of the volume. These are combined to produce a volumetric image of the nuclear spin density of the body.

Spectrally selective pulses are used to image selected components in an object, such as fat and water, or to image metabolites with very low density such as N-acetyl aspartate (NAA), creatine, and choline in the presence of fat and water. However, due to the small chemical shift between individual components (fat and NAA, for example), inhomogeneities in the magnetic field can cause undesired signals to be imaged while wanted signal components move out of the excitation passband. This is a particular problem in "fat saturation," where fat is selectively excited and dephased prior to excitation and imaging of water. Inhomogeneity in the static field, $B_0$, can cause fat to fall outside the excitation passband or cause water to fall inside the passband, resulting in lack of suppression of fat signal or undesired suppression of water signal. Inhomogeneity is also a problem in spectroscopic imaging in the frontal and temporal lobes of the brain where broad magnetic shifts in the static field, $B_0$, can cause fat or water to enter the passband of a spectrally selective excitation intended to excite, for instance, only NAA, or cause NAA signals to fall outside of the spectral passband.

The use of k-space trajectories for selective excitation in three spatial dimensions is heretofore known. See Pauly, U.S. Pat. No. 5,270,653, for example. The present invention is directed to using three-dimensional k-space trajectories for a spectral-spatial excitation where two dimensions are spatial and the third is the spectral or chemical shift dimension. Specifically, the center frequency of a spectral passband is varied as a function of two spatial coordinates.

SUMMARY OF THE INVENTION

In accordance with the invention, simultaneous excitation in two spatial dimensions and one spectral (chemical shift) dimension is provided using k-space trajectories. Desired excitation profiles, arbitrary in phase and magnitude, are achieved simultaneously (i.e. with a single RF pulse) in two spatial dimensions and in the chemical shift dimension, with resolution in all three dimensions limited by gradient hardware capabilities and pulse length. Specifically, an excitation profile of constant shape in the chemical shift dimension is specified. The center frequency of the excitation is varied across a two-dimensional plane by varying the RF excitation to readily correct for main field inhomogeneities.

The invention has proved to be particularly applicable in spectroscopic imaging in areas of poor main field homogeneity, such as the frontal lobes of the brain. The invention has also proved to be particularly applicable in fat suppression in areas of poor main field homogeneity, such as the knees, abdomen, and breast.

The invention and objects and features thereof will be more readily apparent from the following detailed description and appended claims when taken with the drawing.

DETAILED DESCRIPTION OF ILLUSTRATIVE EMBODIMENT

Figure 1A:
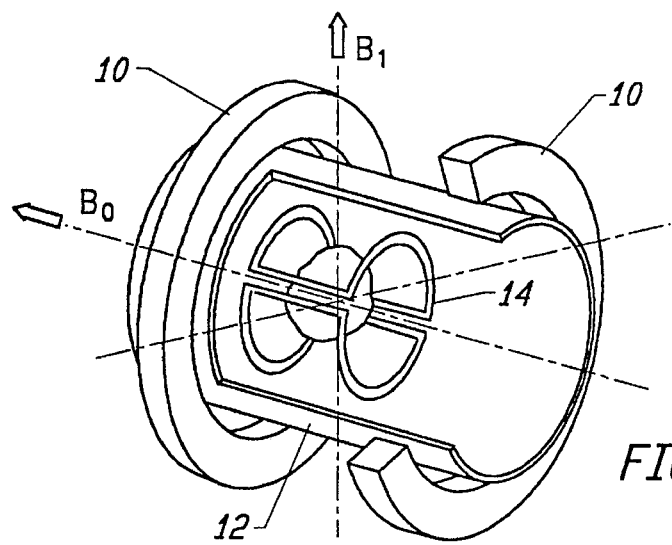
FIGS. 1A–1D illustrate the arrangement of conventional MRI apparatus and magnetic fields generated therein.
Figure 1B:
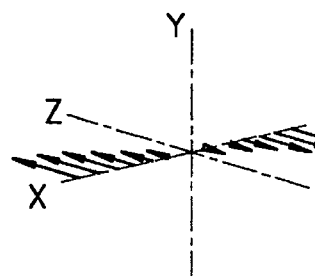
Figure 1C:
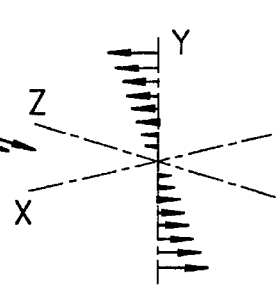
Figure 1D:
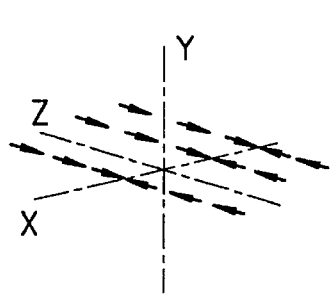

Referring now to the drawings, FIG. 1A is a perspective view, partially in section, illustrating coiled apparatus in an NMR imaging system, and FIGS. 1B–1D illustrate field gradients which are produced in the apparatus of FIG. 1A. This apparatus is discussed by Hinshaw and Lent, "An Introduction to NMR Imaging: From the Bloch Equation to the Imaging Equation," Proceedings of the IEEE, Vol. 71, No. 3, March 1983, pp. 338–350. Briefly, the uniform static field of $B_0$ is generated by the magnet comprising the coil pair 10. A gradient field Gx is generated by a complex gradient coil set which can be wound on the cylinder 12. An RF field B1 is generated by a saddle coil 14. A patient undergoing imaging would be positioned along the Z axis within the saddle coil 14.

In FIG. 1B an X gradient field is shown which is parallel to the static field $B_0$ and varies linearly with distance along the X axis but which does not vary with distance along the Y and Z axes. FIGS. 1C and 1D are similar representations of the Y gradient and Z gradient fields, respectively.

Figure 2:
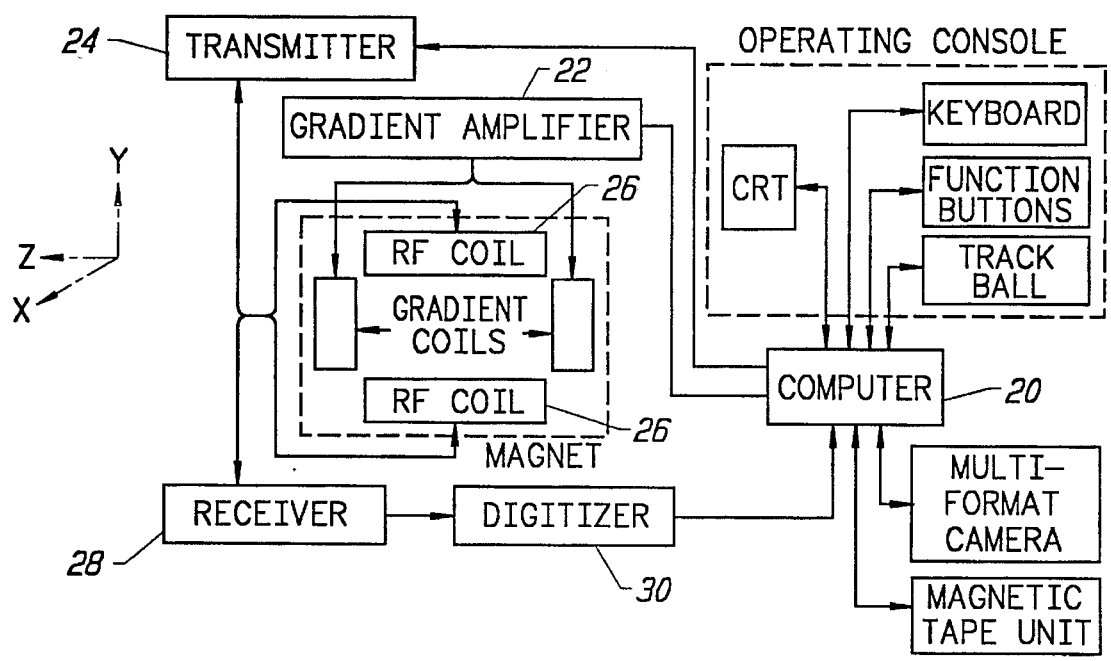
FIG. 2 is a functional block diagram of MRI imaging apparatus.

FIG. 2 is a functional block diagram of the imaging apparatus as disclosed in "NMR-A Perspective on Imaging," General Electric Company, 1982. A computer 20 is programmed to control the operation of the NMR apparatus and process free induction decay (FID) signals detected therefrom. The gradient field is energized by a gradient amplifier 22, and the RF coils for impressing an RF magnetic moment at the Larmor frequency is controlled by the transmitter 24 and the RF coils 26. After the selected nuclei have been flipped, the RF coils 26 are employed to detect the FID signal which is passed to the receiver 28 and thence through digitizer 30 for processing by computer 20.

As noted above, spectrally selective pulses are used to image selected components in an object, such as fat or water, or metabolites such as NAA present in very small concentrations in the presence of fat and water. The present invention overcomes the problem of shifts in the resonant frequency of individual components such as water, fat, or NAA due to inhomogeneities in the static magnetic field. Two specific examples are fat suppression and spectroscopic imaging. In fat suppression in areas of poor main field homogeneity such as the knee, abdomen, and breast, inhomogeneity can cause fat to fall out of the excitation passband and be inadequately excited, or water to fall into the passband and be undesirably excited. In spectroscopic imaging, main field inhomogeneity can cause desired signals such as NAA to fall out of the spectral passband and be poorly excited, and undesired signals such as fat and water to fall within the passband and be poorly suppressed. Using a 3-D spectral-spatial excitation, the center frequency of the spectral passband is varied as a function of two spatial coordinates, and the variation is tailored to field map data to compensate for $B_0$ shifts, thus allowing simultaneous fat and water suppression with a 3-D spectral spatial pulse in spectroscopic imaging, and complete fat suppression in fat suppression imaging.

Figure 3A:
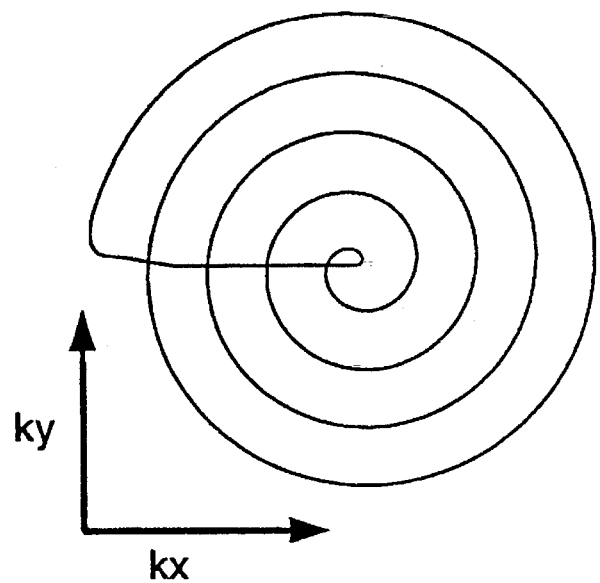
FIGS. 3A, 3B illustrate a single kx, ky trajectory and a complete kx,ky,k-omega trajectory in accordance with the invention.
Figure 3B:
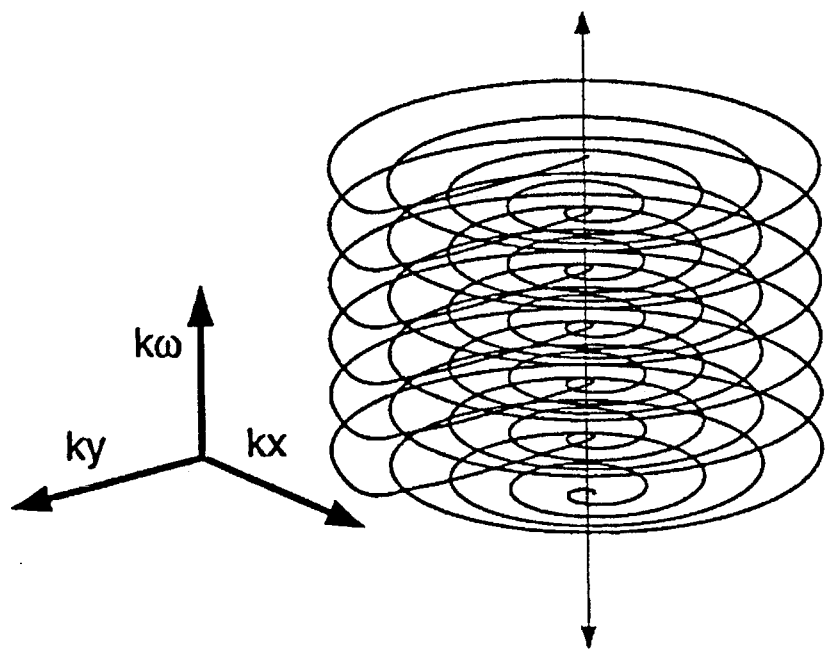

In accordance with one embodiment, the excitation k-space trajectory is a sequence of spirals such as the single spiral kx,ky trajectory of FIG. 3A, repeated in time to give the complete trajectory kx,ky,k-omega of FIG. 3B. To achieve a spectral field of view of 320 Hz, the trajectory is constrained to repeat in kx and ky every 3.125 milliseconds. Under this constraint and the gradient constraints of a 1.5 Tesla GE Signa 5.3 system, a spiral of about 4½ turns is possible with a spatial field of view of 24 cm. This gives a spatial resolution of about 2.7 cm.

To create the RF waveform, the desired excitation profile in x,y and omega is represented on a 128×128×128 grid. The excitation is transformed to k-space by 3-D FFT. The values of the RF waveform are sampled off of the resulting k-space grid along the excitation trajectory, scaled by gradient strength. No constraints are placed on the desired excitation in terms of symmetry or realness. The RF waveform is generally complex, necessitating control of both magnitude and phase of the RF pulse.

Spectral-spatial excitation is often complicated by "halfNyquist" aliasing lobes caused by non-uniform sampling in the frequency dimension. Because the trajectory samples uniformly along the omega axis, no "half-Nyquist" lobes appear, even though sampled points are not on planes of constant k-omega.

Figure 4C:
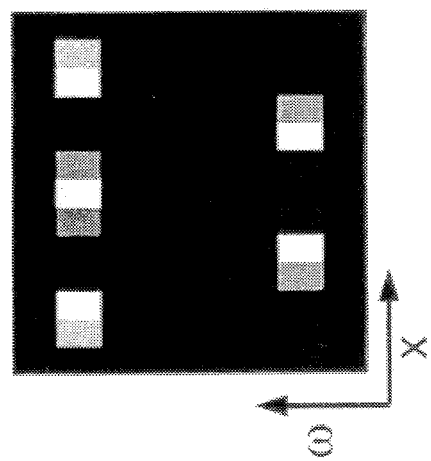
FIGS. 4A, 4B, and 4C illustrate three planes of the magnitude portion of a desired 3-D excitation whose phase portion is zero.
Figure 4B:
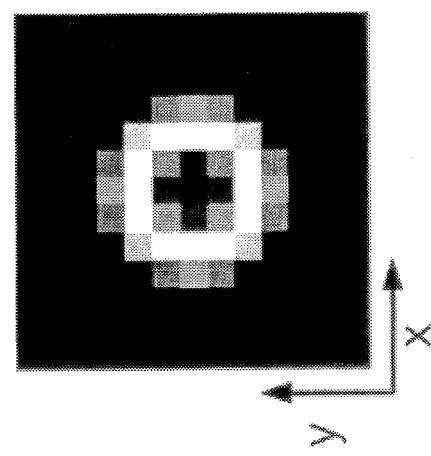
Figure 4A:
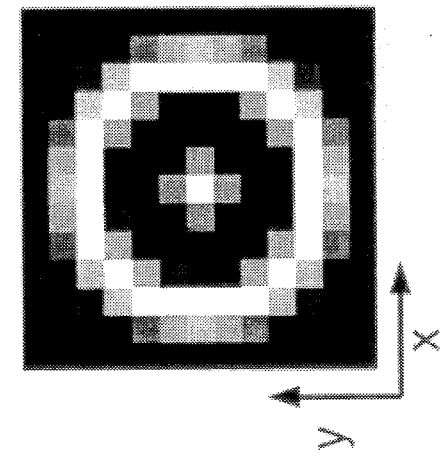
Figure 5B:
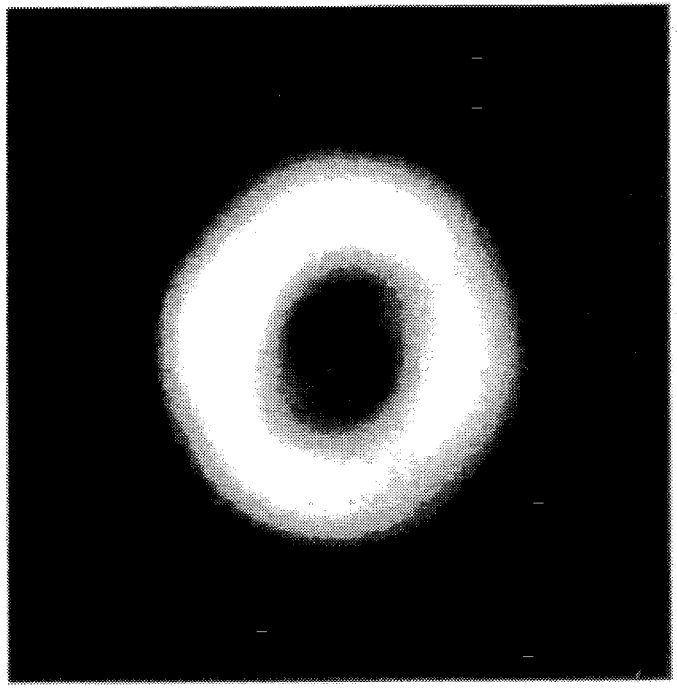
FIGS. 5A, 5B illustrate two planes of the actual resulting excitation.
Figure 5A:
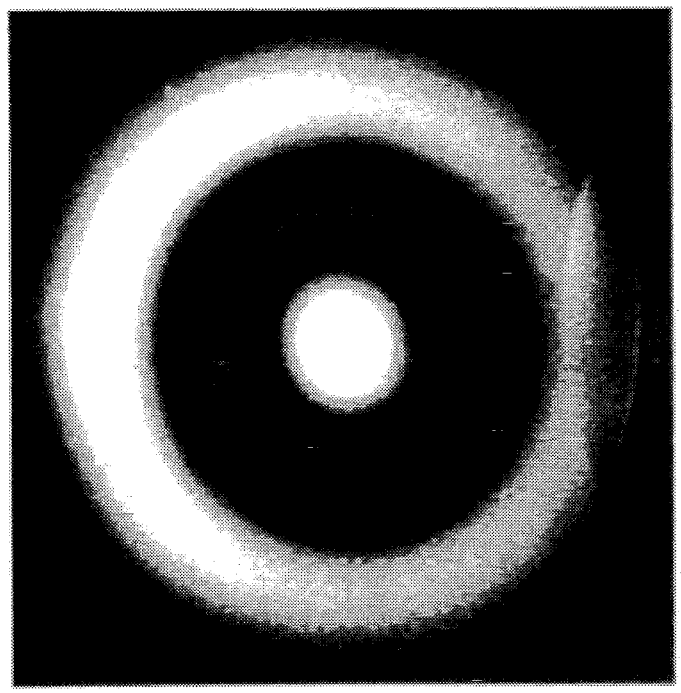

To demonstrate the feasibility of 3-D spectral-spatial excitation with standard gradients, a test excitation is applied to a water phantom. The excitation consists of a target and a ring at different resonant frequencies, as depicted in FIG. 4. The FOV is 320 Hz by 24 cm by 24 cm. Experimental results obtained with a GE Signa 1.5 Tesla magnet are shown in FIG. 5 at two different frequencies.

A resolution of 2.7 cm allows compensation for only gradual $B_0$ shifts. However, faster gradients, possibly employing trajectory shapes other than spirals, will allow finer resolution and wider spectral FOV. A gradient 10 times faster than the system employed above would allow spatial resolution of under 1 cm.

Spiral k-space trajectories allow the design of excitation pulses selective spectrally and in two spatial dimensions. Usable resolution is obtained in all three dimensions with standard gradient hardware. Subject to resolution constraints, arbitrary complex excitations may be achieved.

While the invention has been described with reference to a specific embodiment, the description is illustrative of the invention and is not to be construed as limiting the invention.

Various modifications and applications may occur to those skilled in the art without departing from the true spirit and scope of the invention as defined by the appended claims. Specifically, k-space trajectories other than spirals, such as those constructed of trapezoids or so-called "echo planar" trajectories, fall in the scope of the invention.

What is claimed is:

1. A method of selectively exciting nuclei in an object for magnetic resonance imaging comprising the steps of applying a static magnetic field $B_0$ through said object, and applying an RF excitation pulse to said object which is spatially selective along two axes and spectrally selective in chemical shift whereby arbitrarily specified excitation profiles, with arbitrarily specified magnitude and phase, in two spatial dimensions and one spectral dimension are achieved.

2. The method as defined by claim 1, where the specified excitation profile consists of a passband in the spectral dimension with center frequency varying in two spatial dimensions, whereby spectral shifts due to inhomogeneity of said static magnetic field are compensated by said RF pulses.

3. The method as defined by claim 1 wherein each RF excitation pulse traverses a three dimensional spiral in k-space.

4. The method as defined by claim 1 wherein said spectral-spatial excitation substantially traverses the desired extent of 3-D spatial and spectral k-space.

5. The method as defined by claim 1 and further including the step of detecting free induction decay signals from selected nuclei in said object.

6. The method as defined by claim 5 wherein said object is a brain and said nuclei are selected from the group consisting of N-acetyl aspartate, creatine, choline, lactate, and citrate.

7. The method as defined by claim 6 wherein nuclei of fat and water are not excited.

8. The method defined by claim 1 where the spectrally selective pulse selectively excites fat nuclei but not water nuclei in said object.

9. The method defined by claim 1 where the spectrally selective pulse selectively excites water nuclei but not fat nuclei in said object.

10. A magnetic resonance imaging method of selective nuclei excitation in an object in the presence of an inhomogeneous magnetic field through said object comprising the step of applying a three-dimensional spectral-spatial excitation in which the center frequency of a spectral passband is varied as a function of two spatial coordinates.

11. The method as defined by claim 10 wherein said spectral-spatial excitation traverses an array of spiral trajectories in k-space.

12. The method as defined in claim 10 wherein said spectral-spatial excitation substantially traverses the desired extent of 3-D spatial and spectral k-space.

13. Apparatus for selectively exciting nuclei in an object for magnetic resonance imaging comprising means for applying a static magnetic field $B_0$ through said object, and means for applying RF excitation pulses to said object which are spatially selective along two axes and spectrally selective whereby effects of spectral shifts due to inhomogeneity of said static magnetic field are compensated by said RF pulses.

14. Apparatus as defined by claim 13 wherein each RF pulse traverses a three dimensional spiral in k-space.

15. Apparatus as defined by claim 13 wherein each RF pulse substantially traverses the desired extent of 3-D spatial and spectral k-space.

16. Apparatus as defined by claim 13 and further including means for detecting free induction decay signals from selected nuclei in said plane.

* * * * *